United States Patent
Das

(10) Patent No.: US 9,124,278 B1
(45) Date of Patent: Sep. 1, 2015

(54) HALF RATE SERIALIZATION AND MEMORY CELL FOR HIGH SPEED SERIALIZER-DESERIALIZER

(71) Applicant: Cadence Design Systems, Inc., San Jose, CA (US)

(72) Inventor: Tamal Das, West Bengal (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/704,871

(22) Filed: May 5, 2015

(51) Int. Cl.
*H03M 9/00* (2006.01)
*G11C 8/18* (2006.01)
*H03K 23/66* (2006.01)
*G06F 1/08* (2006.01)
*H04L 7/033* (2006.01)
*H03K 7/06* (2006.01)
*H04L 27/26* (2006.01)
*G06F 1/10* (2006.01)
*H03K 23/68* (2006.01)

(52) U.S. Cl.
CPC . *H03M 9/00* (2013.01); *G11C 8/18* (2013.01); *G06F 1/08* (2013.01); *G06F 1/10* (2013.01); *H03K 7/06* (2013.01); *H03K 23/667* (2013.01); *H03K 23/68* (2013.01); *H04L 7/0337* (2013.01); *H04L 27/2647* (2013.01)

(58) Field of Classification Search
CPC ... H03M 9/00; H04L 7/0337; H04L 27/2647; G06F 1/10; G06F 1/08; H03K 7/06; H03K 23/68; H03K 23/667
USPC .................. 341/101, 100; 375/355, 356, 316; 327/114, 115, 117, 296
See application file for complete search history.

(56) References Cited

U.S. PATENT DOCUMENTS 7,864,084 B2 * 1/2011 Padaparambil ............... 341/101

* cited by examiner

*Primary Examiner* — Joseph Lauture
(74) *Attorney, Agent, or Firm* — Kenyon & Kenyon LLP

(57) ABSTRACT

Methods and systems provide a memory cell and a memory cell system for data serialization. In an embodiment, a half-rate serialization procedure uses a half-rate differential clock to output full-rate serial data. In an embodiment, the memory cell system includes two memory cells each receiving a respective data stream. Each memory cell may be controlled by a respective clock, the clocks being substantially mutually exclusive such that the output of each memory cell becomes alternately tri-stated. Based on the principle of a transistor tri-state or hold mode, if clocks of two memory cells are substantially mutually exclusive, then a tri-stated node can be driven by either of the memory cells in a substantially mutually exclusive manner, effectively multiplexing input parallel data to output serial data. The memory cell system may include a combination of different types of memory cells.

20 Claims, 5 Drawing Sheets

100

150

200

250

300

350

400

450

500

600

700

HALF RATE SERIALIZATION AND MEMORY CELL FOR HIGH SPEED SERIALIZER-DESERIALIZER

FIELD OF THE DISCLOSURE

The present disclosure relates to data communications. More specifically, it relates to a memory cell, a system of at least one memory cell, and a method for ameliorating a bottleneck in a serializer.

BACKGROUND

High speed networks find application in various contexts, including multi-media streaming and cloud computing. High speed networks include network routers and servers, which typically include a serializer-deserializer (SerDes). A SerDes may include a serializer that converts parallel data into serial data, e.g., multi-bit data words into a single-bit data stream. In one aspect, a serializer interfaces between a media access control (MAC) layer and a physical (PHY) layer. The serializer may receive parallel input from the MAC layer and provide serial output to the PHY layer. One or more bottlenecks may occur in the conversion of parallel data to serial data. One bottleneck is the conversion of half-rate data to full-rate serial data. The bottleneck becomes more severe at higher interface speeds. Typical methods for reducing congestion are power intensive, introduce jitter, and/or impose constraints on a duty cycle of a clock. These bottlenecks that occur in data communications such as serialization need to be addressed.

DETAILED DESCRIPTION

Figure 1A:
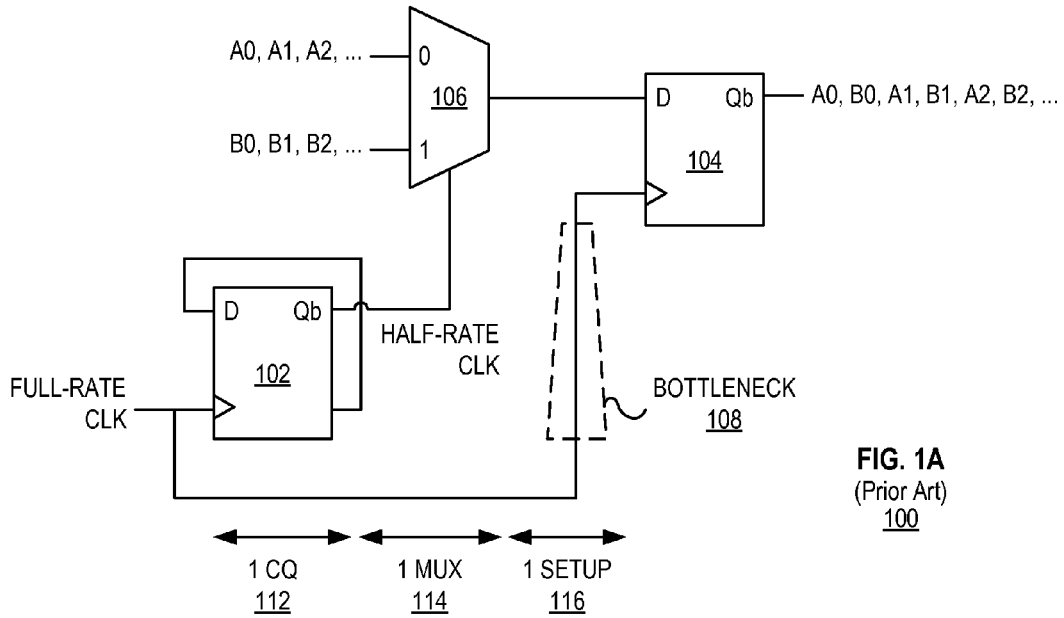
FIG. 1A is a simplified block diagram illustrating a bottleneck of a serialization system.
Figure 1B:
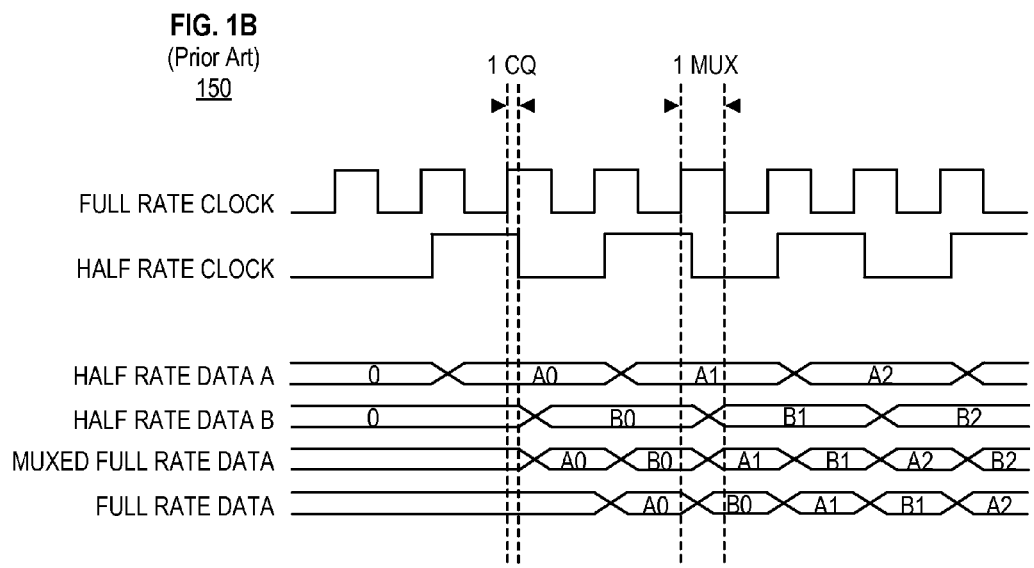
FIG. 1B is a timing diagram for the serialization system shown in FIG. 1A.

One conventional method of handling bottlenecks in the serialization of data is multiplexing parallel input data using a half-rate clock. However, this method may introduce jitter or impose tight constraints on a duty cycle of the half-rate clock. Jitter may be a characterization of how much an edge of a clock moves. The presence of jitter may make it difficult or impossible for a receiver to decode a signal. Another conventional method of handling bottlenecks in the serialization of data is providing a serializer with a final re-timing flop on a full-rate clock. FIG. 1A and FIG. 1B illustrate this concept.

FIG. 1A is a simplified block diagram of a serialization system 100. The serialization system 100 includes a first memory cell 102, a second memory cell 104, and a multiplexer (MUX) 106. The memory cell 102 receives a full-rate clock and divides the received full-rate clock to output a half-rate clock. The memory cell 104 samples input data and outputs data according to the full-rate clock.

In operation, the memory cell 102 samples the full-rate clock signal, divides it, and outputs a half-rate clock signal. The output half-rate clock signal controls the MUX 106. The MUX 106 then outputs its sampled input parallel data (a first stream represented as A0, A1, A2, . . . and a second stream represented as B0, B1, B2, . . . ) according to the half-rate clock output by the memory cell 102. The memory cell 104 receives the output of MUX 106 and outputs a serial data stream (A0, B0, A1, B1, A2, B2, . . . ) according to its clock signal, which is the full-rate clock signal. Thus, parallel half-rate data may be serialized to full-rate data.

The use of the full-rate clock to generate a half-rate clock may have several disadvantages. For instance, due to the half-rate clock, tight constraints may be imposed on components of such a serialization system, particularly at high data rates. A bottleneck 108 may develop as shown in FIG. 1A.

FIG. 1B is a timing diagram 150 for the serialization system 100. FIG. 1B shows areas in the clock signals in which a clock to queue delay (CQ) and a multiplexer delay (MUX) may occur. The full-rate clock signal is the signal input to the memory cell 102 and the memory cell 104. The half-rate clock signal is the signal output from the memory cell 102 and input to the MUX 106. The half-rate data B represents the first data stream input to the MUX 106 (A0, A1, A2, . . . ). The half-rate data A represents the second data stream input to the MUX 106 (B0, B1, B2, . . . ). The multiplexed full-rate data represents an output of the MUX 106. The full-rate data represents the data stream output by the memory cell 104 (A0, B0, A1, B1, A2, B2, . . . ).

An overall delay of the serialization system 100 includes three components: CQ 112 due to internal delay of the memory cell 102, MUX 114 due to internal delay of the MUX 106, and a setup delay (SETUP) 116, which is a length of time it takes for data to be stable before a clock edge. In summary, the timing constraint is:

$$T = 1CQ + 1MUX + 1SETUP \qquad (1)$$

Thus, to allow for accurate serialization, a full-rate clock period (T) must be equal to or greater than the sum of the delay components. The MUX is controlled by a half-rate clock and a full-rate clock for final retiming. As the full-rate clock period T decreases (e.g., according to standards such as PCI Express® Generation 3 and Embedded DisplayPort Version 1.4), it becomes increasingly difficult with respect to both performance and power consumption to accommodate the components of a conventional system such as the one shown in FIG. 1A.

Methods and systems of the present disclosure provide half-rate serialization using a half-rate clock. The half-rate clock may be a differential half-rate clock. A differential clock may be easier to route compared with a single-ended clock, and may have better performance attributes. The serialization systems described herein may include a memory cell referred to as a "dual edge flop," which may use positive edges of complementary half-rate clocks. A particular type of memory cell is not critical to the implementation of the disclosed systems and methods. In an embodiment, a half-rate serializer may be implemented using at least one conventional memory cell. In an alternative embodiment, a half-rate serializer may be implemented using at least one memory cell described herein. In yet another embodiment, a half-rate serializer may be implemented using a combination of conventional memory cells and memory cells described here. Embodiments of the present disclosure may provide a timing constraint that eliminates a MUX delay of conventional serializers:

$$T=1CQ+1SETUP \qquad (2)$$

Thus, embodiments of the present disclosure may have a timing constraint that is easier to meet than, for example, constraint (1) in the above-described conventional system.

Figure 2A:
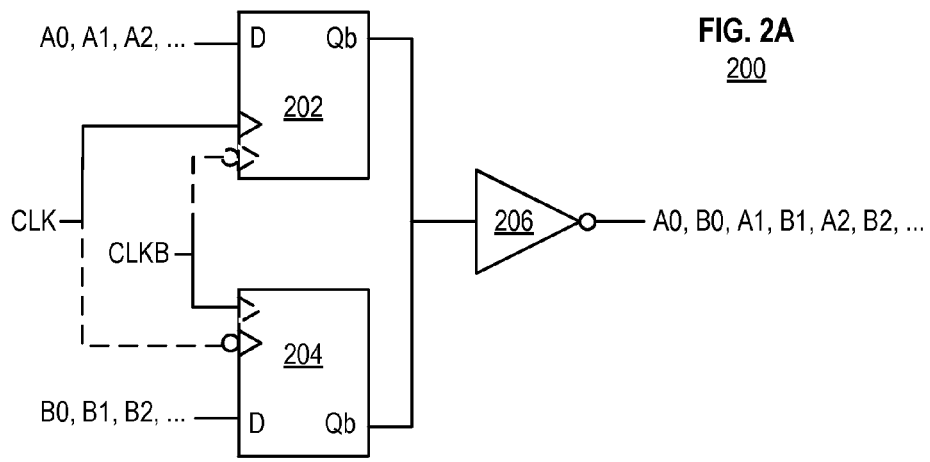
FIG. 2A is a simplified block diagram of a memory cell system according to an embodiment of the present disclosure.

FIG. 2A is a simplified schematic of memory cell system 200 according to an embodiment. The system 200 may include a first memory cell 202, a second memory cell 204, and an inverter 206. The memory cell 202 may sample an input data stream (A0, A1, A2, . . . ), a clock signal CLK, and an optional clock bar signal CLKB. The memory cell 202 may output a signal Qb. The memory cell 204 may sampled an input data stream (B0, B1, B2, . . . ), an optional clock signal CLK, and a clock bar signal CLKB. The memory cell 204 may output a signal Qb. The output of the memory cell 202 and the output of the memory cell 204 may alternately drive the inverter 206 as further described herein. The inverter 206, which may condition a sampled signal and output a serial data stream (A0, B0, A1, B1, A2, B2, . . . ).

As shown, the memory cell system 200 does not require a separate MUX component to provide a multiplexing function. The memory cell system 200 may provide dynamic multiplexing. In an embodiment, dynamic multiplexing may be provided by operating the memory cell system 200 with substantially mutually exclusive clock inputs causing constituent memory cells to become tri-stated at alternate or offset times. The memory cell system 200 may perform multiplexing functions and retiming functions. In an embodiment, at least one memory cell of the memory cell system 200 uses the principle of tri-state or hold mode of a memory cell so that if clocks of two memory cells are substantially mutually exclusive, then a tri-stated node can be driven by either of the memory cells in a substantially mutually exclusive manner. The substantially mutually exclusive characteristic of the clocks reflects the non-ideal nature of clock signals, and is intended to encompass a range of clock tolerances within which the memory cells can operate. That is, the memory cell 202 and the memory cell 204 may drive an output mutually exclusively so that serial data generated therefrom is an interleaving of the respective data streams input to the memory cell 202 and the memory cell 204.

Figure 2B:
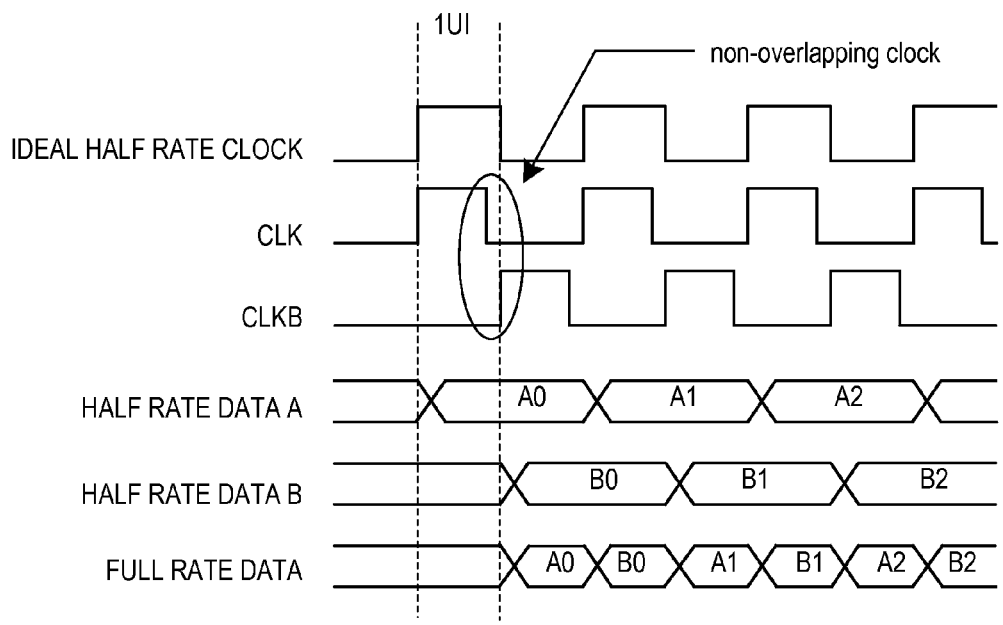
FIG. 2B is a timing diagram of a memory cell system according to an embodiment of the present disclosure.

FIG. 2B is a timing diagram 250 of a memory cell system 200 according to an embodiment. The timing diagram 250 shows an ideal half-rate clock signal for reference. The ideal half-rate clock signal shows a size of a unit interval (UI). In an embodiment, a unit interval is a period for a full-rate clock. The timing diagram 250 also shows an example clock signal CLK. The CLK signal may be a half-rate clock signal. The timing diagram 250 also shows an example clock bar signal CLKB. The timing diagram 240 also shows an example half-rate data stream B (A0, A1, A2, . . . ). The timing diagram 240 also shows an example half-rate data stream data A (B0, B1, B2, . . . ). The timing diagram 240 also shows an example full-rate data stream (A0, B0, A1, B1, A2, B2, . . . ).

As shown, CLK and CLKB may be inputs to the memory cell 202 and the memory cell 204. The half-rate data stream B may be input to the memory cell 202. The half-rate data stream A may be input to the memory cell 204. The multiplexed full-rate data may be output by the inverter 206.

In an embodiment, the duty cycle of each of CLK and CLKB may be selected such that, as shown, their complementary edges do not overlap. In conventional systems in which an inverter delay exceeds CLK, data cannot be completely pushed to the output. This may be due to manufacturing limitations of inverters. By selecting the duty cycle of the half-rate clocks such that their complementary edges do not overlap, two operations of the inverter may be completed within 1UI.

Figure 3A:
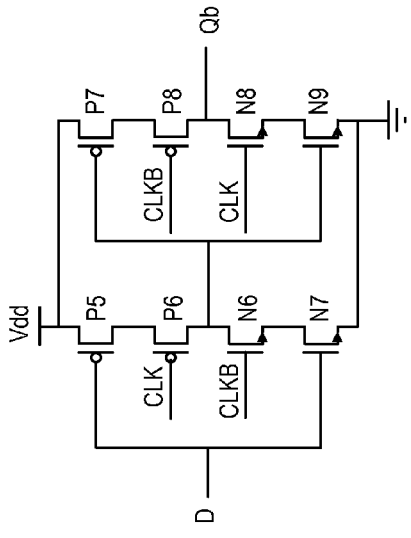
FIG. 3A is a simplified schematic of a memory cell according to an embodiment of the present disclosure.

FIG. 3A is a simplified schematic of a memory cell 300 by way of non-limiting embodiment. The memory cell 300 may include input for sampling input data D, input for sampling a clock signal CLK, and output for outputting a signal Qb. The memory cell 300 may be referred to as a "true single-phase clock flop" or a "TSPC flop".

The memory cell 300 may include a first stage (also referred to as a "master stage"). The master stage may be implemented by transistors P1, P2, and N1. The master stage may sample data D as input. As shown, the transistors P1 and N1 may sample input D at respective gates. The output of the master stage may be obtained at a node joining respective drains of P2 and N1.

The memory cell 300 may include a second stage implemented by transistors P3, N2, and N3. The memory cell 300 may include an output stage implemented by transistors P4, N4, and N5. An output of the master stage may be passed to the second stage via a node connecting respective drains of the transistors P2 and N1 and a gate of the transistor N2.

An output of the second stage may be passed to the output stage via a node connecting respective drains of the transistors P3 and N2 and respective gates of the transistors P4 and N5. The output Qb may be obtained from a node joining respective drains of the transistors P4 and N4. The transistors P3, N3, and N4 may receive a clock signal CLK at respective gates. A respective source of the transistors P1, P3, and P4 may be tied to a reference voltage Vdd. A respective source of the transistors N1, N3, and N5 may be tied to ground.

The memory cell 300 may be a positive edge triggered flop. The memory cell 300 may be tri-stated when CLK level is low. When the memory cell 300 is tri-stated, the output may be preserved or an input may be held. In particular, the input data is loaded into the master stage (P1, P2, and N1) and the output Qb of the memory cell is tri-stated and holds the input data.

By way of non-limiting embodiment, each of the transistors P1, P2, P3, and P4 is implemented in PMOS and each of the transistors N1, N2, N3, N4, and N5 are implemented in NMOS. One of ordinary skill in the art would appreciate that the transistors may be implemented by other transistor types.

Figure 3B:
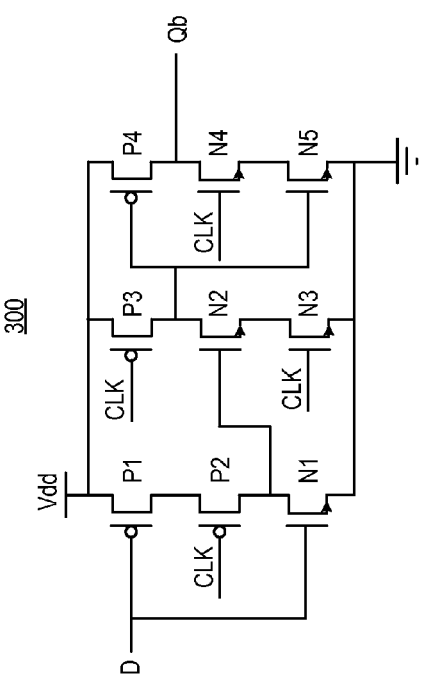
FIG. 3B is a timing diagram corresponding to the memory cell shown in FIG. 3A according to an embodiment of the present disclosure.

FIG. 3B is a timing diagram 350 for the memory cell 300 by way of non-limiting embodiment. The timing diagram 350 shows a clock signal CLK, an input signal D, and an output signal Qb. As shown, D may be a signal carrying data. Signal D may be high for a number of clock cycles and low for other clock cycles. The output Qb may be based on the input D and may be subject to delays due to circuitry. In an embodiment, the output Qb may be an inverted version of the input D. The timing diagram 350 also shows an example CQ and hold state, as further discussed herein.

At time T0, CLK level is low and the memory cell is in the first mode of operation. The input data is loaded into the master stage. The output Qb is tri-stated. Thus, the output is data held in the memory cell 300 based on previous data, which is high (not shown). At T1, CLK goes high and the memory cell 300 is no longer tri-stated. Thus, the output Qb is the inverse of the input D.

At time T2, CLK goes low and the memory cell 300 becomes tri-stated, maintaining the previous output (high). At time T3, CLK goes high and the memory cell is no longer tri-stated. As shown, the transition in Qb may be subject to a CQ delay and not transition until T4, which is sometime after T3. At time T4, the output Qb may be the inverse of the input D, which is low. The CQ delay is represented as the duration between times T3 and T4. Between times T4 and T7, the input D is high. Thus, regardless of the mode of operation, either the input D is inverted and passed to the output Qb, or the tri-state maintains a previous output. In either case, the output Qb is low.

At time T7, CLK goes low and the memory cell becomes tri-stated, maintaining the previous value (low). Thus, although the input D goes low about half-way through the hold state, which, without tri-stating would cause the output Qb to go high, the output Qb remains low for the duration of the hold state until time T8. In an embodiment, the output Qb may remain low for the duration of the hold state and any CQ delay until time T9.

Figure 4A:
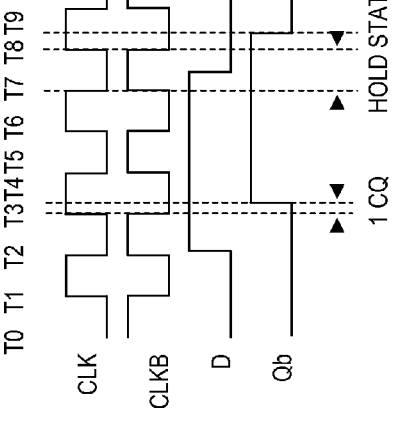
FIG. 4A is a simplified schematic of a memory cell according to an embodiment of the present disclosure.

FIG. 4A is a simplified schematic of a memory cell 400 by way of non-limiting embodiment. The memory cell 400 may include input for receiving input data D, input for receiving a clock signal CLK, and output for outputting a signal Qb. The memory cell 400 may be referred to as a "dynamic double phase flop" or a "D flop".

The memory cell 400 may include a first stage (also referred to as a "master stage"). The master stage may be implemented by transistors P5, P6, N6, and N7. The master stage may sample data D as input. As shown, the transistors P5 and N7 may sample input D at respective gates. The output of the master stage may be obtained at a node joining respective drains of P6 and N6.

The memory cell 400 may include an output stage implemented by transistors P7, P8, N8, and N9. An output of the master stage may be passed to the output stage via a node connecting respective drains of the transistors P6 and N6 and respective gates of the transistors P7 and N9. The transistors P6 and N8 may receive a clock signal CLK at respective gates. The transistors N6 and P8 may receive a clock bar signal CLKB at respective gates. A respective source of transistors P5 and P7 may be tied to a reference voltage Vdd. A respective source of the transistors N7 and N9 may be tied to ground. The output Qb may be obtained from a node joining respective drains of the transistors P8 and N8.

The memory cell 400 may be a positive edge triggered flop. The memory cell 400 may be tri-stated when CLK level is low (i.e., when CLKB is high). When the memory cell 400 is tri-stated, the output may be preserved or held input. In particular, the input data is loaded into the master stage (P5, P6, N6, and N7) and the output Qb of the memory cell is tri-stated and holds the input data.

Figure 4B:
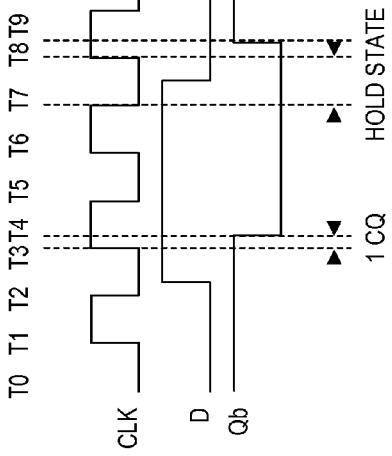
FIG. 4B is a timing diagram corresponding to the memory cell shown in FIG. 4A according to an embodiment of the present disclosure.

FIG. 4B is a timing diagram 450 for the memory cell 400 by way of non-limiting embodiment. The timing diagram 450 shows a clock signal CLK, an inverted clock signal CLK bar, a data signal D, and an output signal Qb. As shown, D may be a signal carrying data. Signal D may be high for a number of clock cycles and low for other clock cycles. The output Qb may be based on the input D and may be subject to delays due to circuitry. In an embodiment, the output Qb may be an inverted version of the input D.

At time T0, CLK level is low, CLKB is high, and input data D is low. Because CLK level is low, the memory cell 400 may be tri-stated. Thus, the memory cell 400 may output previous data (not shown), which is low. At T1, CLK goes high, CLKB goes low, and input data D is low. The memory cell 400 is no longer tri-stated. The output stage may invert the input data. Thus, the output Qb is substantially the same as the input data, as shown. At time T2, CLK goes low, CLKB goes high, and input data D goes high. The memory cell 400 is tri-stated. Thus output the output Qb may be the previous data, which is low.

At time T3, CLK goes high, CLKB goes low, and input data D is high. The memory cell 400 is not tri-stated. The master stage may invert the input data D and the output stage may invert the inverted input data D for output as Qb. Qb is expected to be high. However, the transition in Qb may be subject to a CQ delay and may not occur until T4, which is sometime after T3, as shown. The CQ delay is represented as the duration between times T3 and T4. Between times T4 and T7, the input D is high. Thus, regardless of the mode of operation, either the input D is inverted and passed to the output Qb, or the tri-state maintains a previous output. In either case, the output Qb is low.

At time T7, CLK goes low and the memory cell becomes tri-stated, maintaining the previous value (low). Thus, although the input D goes low about half-way through the hold state, which, without tri-stating would cause the output Qb to go high, the output Qb remains low for the duration of the hold state until time T8. In an embodiment, the output Qb may remain low for the duration of the hold state and any CQ delay until time T9.

Figure 5:
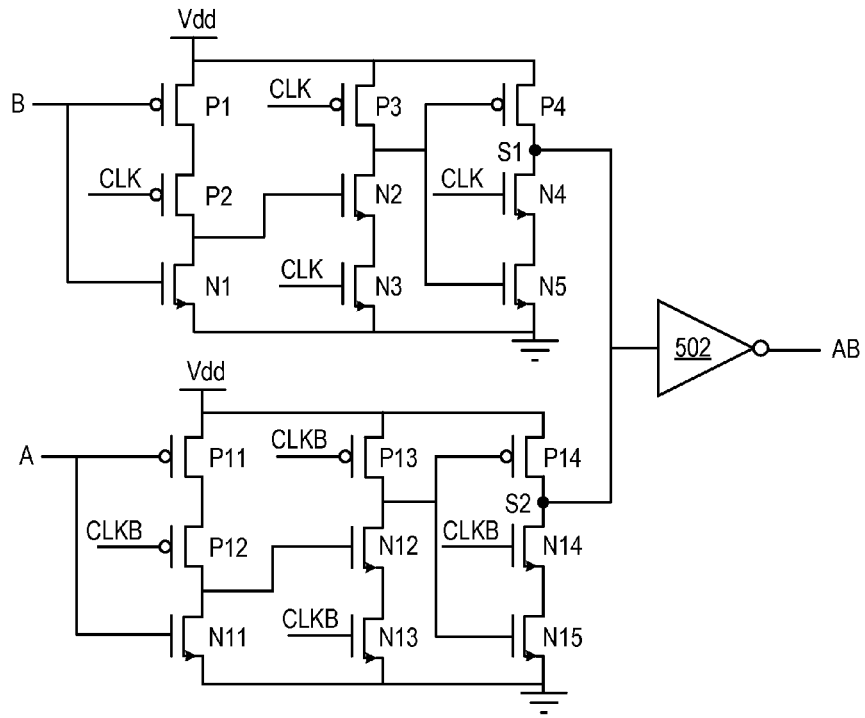
FIG. 5 is a simplified block diagram of a memory cell system according to an embodiment of the present disclosure.

FIG. 5 is a simplified block diagram of a memory cell system 500 according to an embodiment. The memory cell system 500 may include one or more TSPC flops and an inverter 502. A first TSPC flop ("flop" for simplicity) may be implemented by transistors P1, P2, N1, P3, N2, N3, P4, N4, and N5. A second TSPC flop ("flop" for simplicity) may be implemented by transistors P11, P12, N11, P13, N12, N13, P14, N14, and N15. Each TSPC flop may be implemented according to the methods and systems described herein, e.g., according to FIG. 3A.

In operation, the first flop may sample input data A and the second flop may sample input data B. The first flop and the second flop may be operated according to clock signal CLK and clock bar signal CLKB. Each flop may be tri-stated at a respective output node S1, S2. While one flop is tri-stated, the other flop may drive the inverter 502. More specifically, node S1 may be tri-stated when CLK level is low. Node S2 may be tri-stated when CLKB is low. CLK and CLKB may be selected to be substantially mutually exclusive so that a combined output of the flops can be driven by either of the flops in a substantially mutually exclusive manner. The output of each flop may be further conditioned by the inverter 502, producing serial data output AB.

Figure 6:
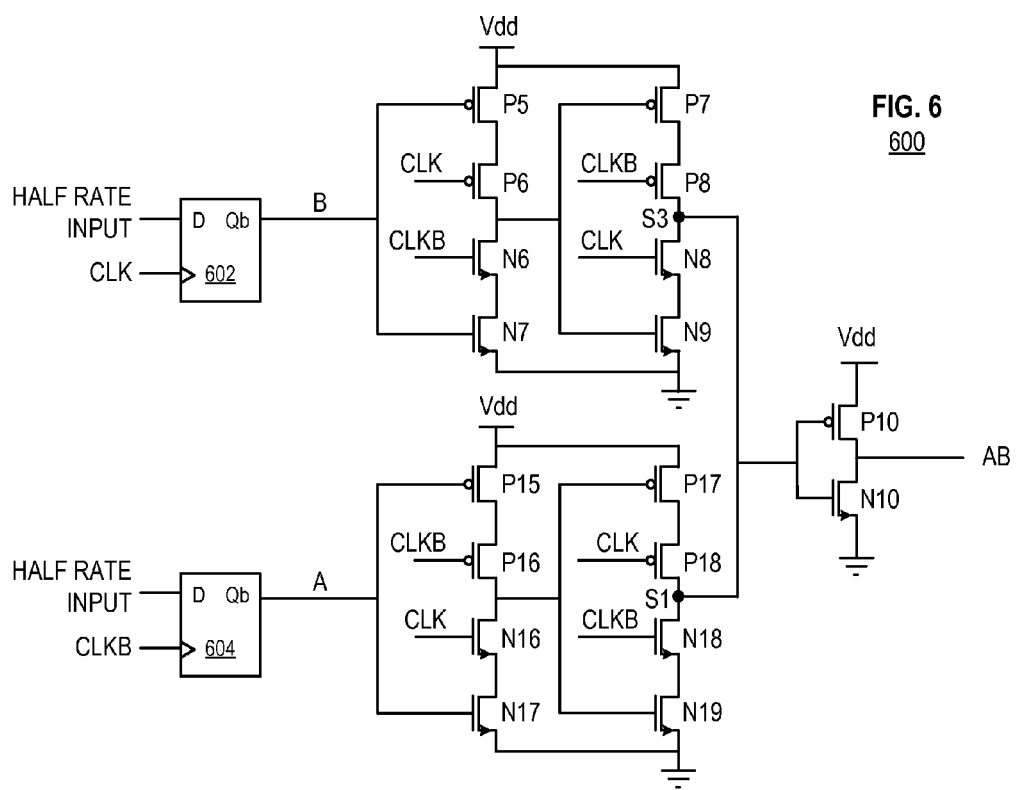
FIG. 6 is a simplified block diagram of a memory cell system according to an embodiment of the present disclosure.

FIG. 6 is a simplified block diagram of a memory cell system 600 according to an embodiment. The memory cell system 600 may include one or more D flops and an inverter. A first D flop may be implemented by transistors P5, P6, N6, and N7. The memory cell system 600 may include one or more conditioning memory cells 602 and 604. A second D flop may be implemented by transistors P7, P8, N8, and N9. Each D flop may be implemented according to the methods and systems described herein. The inverter may be implemented by the transistors P10 and N10, e.g., according to FIG. 4A.

In operation, data inputs A and B may be conditioned by the memory cells 602 and 604. The memory cells 602 and 604 may each sample a half-rate data input and receive a clock signal CLK or CLKB. The first D flop may sample input data A and the second D flop may sample input data B. The first D flop and the second D flop may be operated according to clock signal CLK and clock bar signal CLKB. Each D flop may be tri-stated at a respective output node S3, S4. While one D flop is tri-stated, the other D flop may drive the inverter. More specifically, node S3 may be tri-stated when CLK level is high (i.e., when CLKB is low) such that the inverter is driven by the D flop corresponding to input data B while the D flop corresponding to input data A holds the data. Node S4 may be tri-stated when CLKB is high (i.e., when CLK level is high) such that the inverter is driven by the D flop corresponding to input data A, while the D flop corresponding to input data B holds the data. CLK and CLKB may be selected to be substantially mutually exclusive so that a combined output of the flops can be driven by either of the flops in a substantially mutually exclusive manner. The output of each flop may be further conditioned by the inverter implemented by the transistors P10 and N10, producing serial data output AB.

In another aspect, embodiments of the present disclosure provide equalization to offset effects of channel imperfections. Channel imperfections may make data recovery more difficult. Equalization may be performed at a receiver side and/or a transmitter side to compensate for channel imperfections. For example, a transmitter may perform feed-forward equalization (FFE). FFE may be implemented by a finite impulse response (FIR) filter with three taps. Embodiments of the present disclosure generate a one unit interval (1UI) time-delayed data stream that is compatible with FFE in a transmitter.

Figure 7:
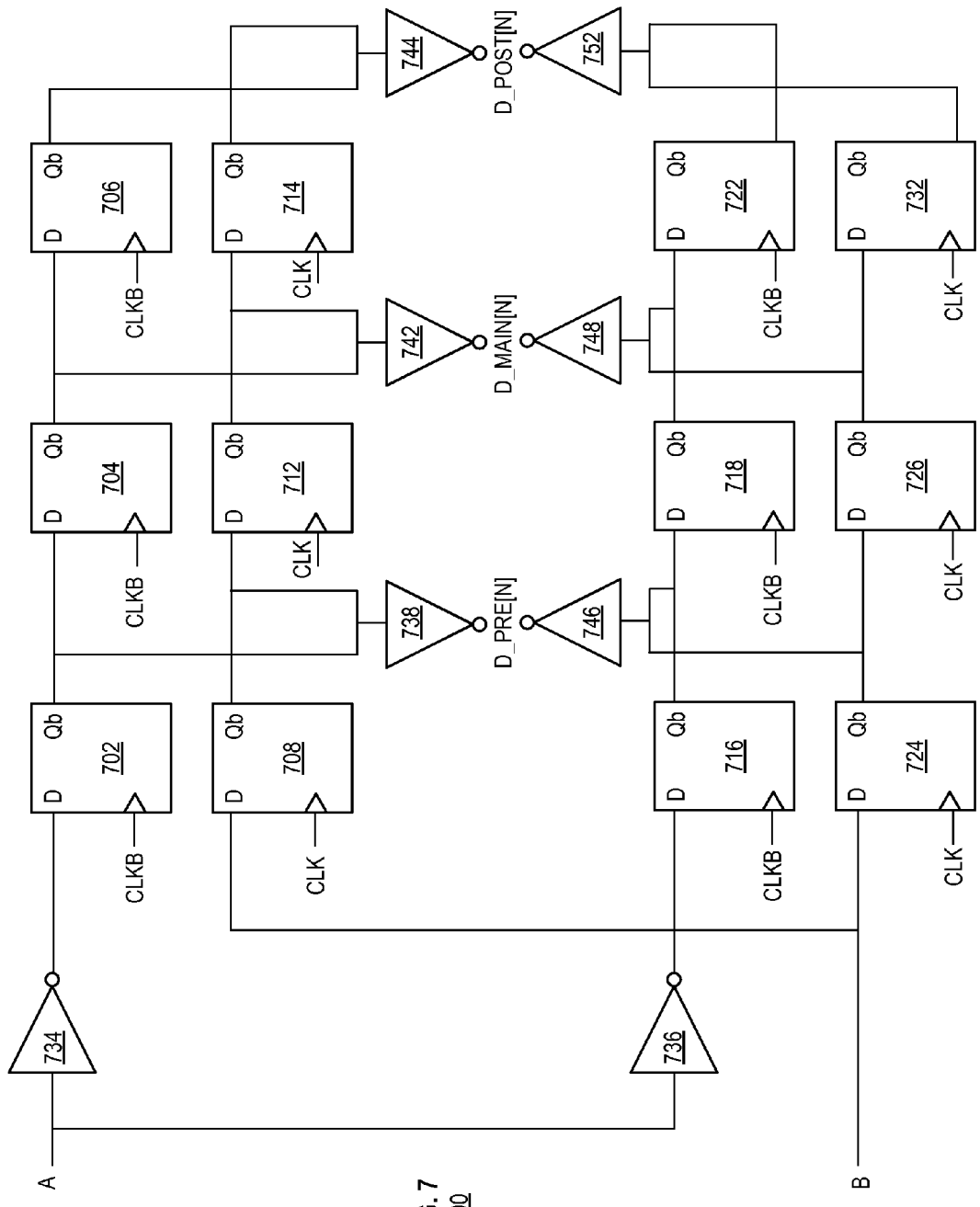
FIG. 7 is a simplified block diagram of a memory cell system compatible with an equalizer according to an embodiment of the present disclosure.

FIG. 7 is a simplified block diagram of a memory cell system 700 according to an embodiment. The memory cell system 700 may generate output compatible with an equalizer. The memory cell system 700 may include a serializer and may generate three data streams for FFE. The data streams may include a pre-cursor (d_pre[n]), a main sample (d_main[n]), and a post cursor (d_post[n]). d_pre[n], d_main[n], and d_post[n] may be delayed by 1UI (one clock cycle) relative to each other.

The memory cell system 700 is able to handle a variety of data rates including very high data rates. The memory cell system may include memory cells 702, 704, 706, 708, 712, 714, 716, 718, 722, 724, 726, and 732. The memory cells may be implemented according to one or more of the methods and systems described herein. The memory cell system may include inverters 734, 736, 738, 742, 744, 746, 748, and 752.

The memory cells 702, 704, and 706 may be serially and communicatively coupled to each other such that an output Qb of the memory cell 702 is received as input to the memory cell 704 and an output Qb of the memory cell 704 is received as input to the memory cell 706. The memory cells 708, 712, and 714 may be serially and communicatively coupled to each other such that an output Qb of the memory cell 708 is received as input to the memory cell 712 and an output Qb of the memory cell 712 is received as input to the memory cell 714. The memory cells 716, 718, and 722 may be serially and communicatively coupled to each other such that an output Qb of the memory cell 716 is received as input to the memory cell 718 and an output Qb of the memory cell 718 is received as input to the memory cell 722. The memory cells 724, 726, and 732 may be serially and communicatively coupled to each other such that an output Qb of the memory cell 724 is received as input to the memory cell 726 and an output Qb of the memory cell 726 is received as input to the memory cell 732.

Inverter 738 may be communicatively coupled to the memory cell 702 and the memory cell 708 such that the inverter 738 receives as input: an output Qb of the memory cell 702 and an output Qb of the memory cell 708. Inverter 742 may be communicatively coupled to the memory cell 704 and the memory cell 712 such that the inverter 742 receives as input: an output Qb of the memory cell 704 and an output Qb of the memory cell 712. Inverter 744 may be communicatively coupled to the memory cell 706 and the memory cell 714 such that the inverter 744 receives as input: an output Qb of the memory cell 706 and an output Qb of the memory cell 714. Inverter 746 may be communicatively coupled to the memory cell 716 and the memory cell 724 such that the inverter 746 receives as input: an output Qb of the memory cell 716 and an output Qb of the memory cell 724. Inverter 748 may be communicatively coupled to the memory cell 718 and the memory cell 726 such that the inverter 748 receives as input: an output Qb of the memory cell 718 and an output Qb of the memory cell 726. Inverter 752 may be communicatively coupled to the memory cell 722 and the memory cell 732 such that the inverter 752 receives as input: an output Qb of the memory cell 722 and an output Qb of the memory cell 732.

In operation, as shown, each memory cell may be driven by CLK or CLKB. Input data A may be conditioned by the inverters 734 and 736. The conditioned input data A may be input to each of the memory cells 702 and 716. Input data B may be sampled by each of the memory cells 708 and 724. The pre-cursor (d_pre[n]) may be generated by output of the memory cells 702, 708, 716, and 724. The main sample (d_main[n]) may be generated by output of the memory cells 704, 712, 718, and 726. The post-cursor (d_post[n]) may be generated by output of the memory cells 706, 714, 722, and 732. As shown, each of d_pre[n], d_main[n], and d_post[n] may be a differential signal.

In an embodiment, a timing constraint for the memory cell system 700 includes three components:

$$T = 1CQ + 1INV + 1SETUP \qquad (2)$$

where INV represents an inverter delay. Compared with a conventional system, i.e., having constraint (1), the memory cell system 700 eliminates a MUX delay. In other words, a half-rate clock alone (without a full-rate clock) may be used in combination with the tri-stating phase multiplexing property of a memory cell to produce a serial output of input parallel data with reduced delay compared with conventional methods and systems.

In an embodiment, the methods and systems described herein may be modified. A full-rate clock may be delayed to permit increased setup time (i.e., may reduce a constraint on setup time) at a final re-timing flop. In another embodiment, a MUX component may be integrated with a retiming flop to merge a setup time and a MUX delay. The MUX and the retiming flop may be complementary.

Although the foregoing description includes several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

The present specification describes components and functions that may be implemented in particular embodiments which may operate in accordance with one or more particular standards and protocols. However, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures.

In addition, in the foregoing Detailed Description, various features may be grouped or described together the purpose of streamlining the disclosure. This disclosure is not to be interpreted as reflecting an intention that all such features are required to provide an operable embodiment, nor that the claimed embodiments require more features than are expressly recited in each claim. Rather, as the following claims reflect, subject matter may be directed to less than all of the features of any of the disclosed embodiments. Thus, the following claims are incorporated into the Detailed Description, with each claim standing on its own as defining separately claimed subject matter.

Also, where certain claims recite methods, sequence of recitation of a particular method in a claim does not require that that sequence is essential to an operable claim. Rather, particular method elements or steps could be executed in different orders without departing from the scope or spirit of the invention.

What is claimed is:

1. A serializer to sample data in parallel and output serial data, the serializer comprising:
   a first memory cell to sample a first input data stream, the first memory cell including:
      a first clock input to receive a first clock signal;
      a first output; and
   a second memory cell to sample a second input data stream, the second memory cell including:
      a second clock input to receive a second clock signal; and
      a second output;
   wherein the first output and the second output are coupled to a common output node;
   wherein the first clock input and the second clock input are substantially mutually exclusive such that the first memory cell and the second memory cell are tri-stated in substantially mutually exclusive manner and the common output node is driven to output the serial data.

2. The serializer of claim 1, wherein the first output is tri-stated responsive to the first clock signal being low; and
   wherein while the first output is tri-stated, the first output is maintained based on a previous output of the first memory cell.

3. The serializer of claim 1, wherein each of the first clock signal and the second clock signal is a half-rate clock signal.

4. The serializer of claim 1, wherein the output serial data is based on a multiplexing of the sampled parallel data.

5. The serializer of claim 1, wherein at least one of the first memory cell and the second memory cell is a true single-phase clock flip flop.

6. The serializer of claim 1, wherein at least one of the first memory cell and the second memory cell is a dynamic double phase flip flop.

7. The serializer of claim 1, wherein complementary edges of the first clock signal and the second clock signal are non-overlapping.

8. The serializer of claim 1, wherein a full rate time period corresponding to the serializer includes a clock to output delay and a set up delay and excludes a multiplexer delay.

9. The serializer of claim 1, further comprising an inverter coupled to the common output node to condition the serial data prior to the output of the serial data.

10. The serializer of claim 9, wherein the first memory cell includes:
    a first stage including a first transistor, a second transistor, and a third transistor, wherein the first and third transistors each includes a gate for sampling the first input data stream and the second transistor includes a gate for receiving the first clock signal;
    a second stage including a fourth transistor, a fifth transistor, and a sixth transistor, wherein the fourth and sixth transistors each includes a gate for sampling the first clock signal and the fifth transistor includes a gate for receiving an output of the first stage;
    an output stage including a seventh transistor, an eighth transistor, and a ninth transistor, wherein the eighth transistor includes a gate for receiving the first clock signal and the seventh and ninth transistors each includes a gate for receiving an output of the second stage.

11. The serializer of claim 10, wherein the second memory cell includes:
    a first stage including a tenth transistor, a eleventh transistor, and a twelfth transistor, wherein the tenth and twelfth transistors each includes a gate for sampling the second input data stream and the eleventh transistor includes a gate for receiving the second clock signal;
    a second stage including a thirteenth transistor, a fourteenth transistor, and a fifteenth transistor, wherein the thirteenth and fifteenth transistors each includes a gate for receiving the second clock signal and the fourteenth transistor includes a gate for receiving an output of the first stage of the second memory cell;
    an output stage including a sixteenth transistor, a seventeenth transistor, and an eighteenth transistor, wherein the seventeenth transistor includes a gate for receiving the second clock signal and the sixteenth and eighteenth transistors each includes a gate for receiving an output of the second stage of the second memory cell.

12. The serializer of claim 1, wherein the first memory cell further includes a first clock bar input to receive a first clock bar signal; and
    wherein the second memory cell further includes a second clock bar input to receive a second clock bar signal.

13. The serializer of claim 12, wherein the first clock signal and the first clock bar signal are complementary; and
    wherein the second clock signal and the second clock bar signal are complementary.

14. The serializer of claim 12, further comprising an inverter coupled to the common output node to condition the serial data prior to the output of the serial data.

15. The serializer of claim 14, wherein the first memory cell includes:
    a first stage including a first transistor, a second transistor, a third transistor, and a fourth transistor, wherein the first and fourth transistors each includes a gate for sampling the first input data stream, the second transistor includes a gate for receiving the first clock signal, and the third transistor includes a gate for receiving the first clock bar signal;

an output stage including a fifth transistor, a sixth transistor, a seventh transistor, and an eighth transistor, wherein the fifth and eighth transistors each includes a gate for receiving an output of the first stage, the fifth transistor includes a gate for receiving the first clock bar signal, and a sixth transistor includes a gate for receiving the first clock signal.

16. The serializer of claim 15, wherein the second memory cell includes:

a first stage including a ninth transistor, a tenth transistor, a eleventh transistor, and a twelfth transistor, wherein the ninth and twelfth transistors each includes a gate for sampling the second input data stream, the tenth transistor includes a gate for receiving the second clock bar signal, and the eleventh transistor includes a gate for receiving the second clock signal;

an output stage including a thirteenth transistor, a fourteenth transistor, a fifteenth transistor, and a sixteenth transistor, wherein the thirteenth and sixteenth transistors each includes a gate for receiving an output of the first stage of the second memory cell, the fifteenth transistor includes a gate for receiving the second clock signal, and the sixteenth transistor includes a gate for receiving the second clock bar signal.

17. A serializer to receive data in parallel and output serial data, the serializer comprising:

a first memory cell to sample a first input data stream, the first memory cell including:
a first clock input to receive a first clock signal;
a first output; and a second memory cell to sample a second input data stream, the second memory cell including:
a second clock input to receive a second clock signal; and
a second output;

wherein the first output and the second output are coupled to a common output node;

wherein the first output is tri-stated responsive to the first clock signal being low; and wherein while the first output is tri-stated, the first output is maintained based on a previous output of the first memory cell.

18. A serializer to receive data in parallel and output differential serial data, the serializer comprising:

a first set of memory cells to sample a first input data stream, the first set of memory cells including:
a first memory cell to receive a first clock signal;
a second memory cell to receive a second clock signal; and a second set of memory cells to sample a second input data stream, the second set of memory cells including:
a third memory cell to receive the first clock signal;
a fourth memory cell to receive a second clock signal; and wherein the first clock signal and the second clock signal are substantially mutually exclusive such that the first memory cell and the third memory cell are tri-stated in substantially mutually exclusive manner and a common output node is driven by the first and third memory cells according to the first clock signal and the second clock signal; and wherein the first set of memory cells generates a first differential component of an output and the second set of memory cells generates a second differential component of the output.

19. The serializer of claim 18, wherein the output forms a part of a time-delayed data stream compatible with three-tap equalization.

20. The serializer of claim 18, further comprising: at least one inverter coupled before at least one of the first set of memory cells and at least one of the second set of memory cells to condition the first input data stream.

\* \* \* \* \*